United States Patent [19]

Schilling

[11] Patent Number: 4,494,170
[45] Date of Patent: Jan. 15, 1985

[54] DECOUPLING CAPACITOR AND METHOD OF MANUFACTURE THEREOF

[75] Inventor: Donald P. Schilling, Woodstock, Conn.

[73] Assignee: Rogers Corporation, Rogers, Conn.

[21] Appl. No.: 551,469

[22] Filed: Nov. 14, 1983

[51] Int. Cl.³ .............. H01G 1/14; H01G 7/00/9/00
[52] U.S. Cl. ................................. 361/306; 29/25.42; 361/433
[58] Field of Search ............... 29/25.42; 174/72 B; 361/306, 321, 322, 392, 393, 402, 404, 433

[56] References Cited

U.S. PATENT DOCUMENTS

| | | | |
|---|---|---|---|
| 3,880,493 | 4/1975 | Lockhart | 339/147 R |
| 4,090,231 | 5/1978 | Millard et al. | 361/433 |
| 4,356,532 | 10/1982 | Donaher et al. | 361/393 |
| 4,394,713 | 7/1983 | Yoshida | 361/433 |
| 4,401,844 | 8/1983 | Fleuret | 174/72 B |
| 4,408,259 | 10/1983 | Muranaka et al. | 361/433 X |

FOREIGN PATENT DOCUMENTS 58-20556 2/1983 Japan .

OTHER PUBLICATIONS

Opened Japanese Patent Application P51-41864 10/1974.
List of Prior Patent Applications 2 pages.

Primary Examiner—Donald Griffin
Attorney, Agent, or Firm—Fishman & Dionne

[57] ABSTRACT

A decoupling capacitor and method of manufacture thereof are presented wherein the decoupling capacitor is formed in a two step molding process. The decoupling capacitor is a hermetically sealed capacitive unit consisting of a ceramic capacitor, active leads bonded to the capacitor and dummy pins for auto-insertion into printed circuit boards.

11 Claims, 4 Drawing Figures

DECOUPLING CAPACITOR AND METHOD OF MANUFACTURE THEREOF

BACKGROUND OF THE INVENTION

This invention relates to the field of decoupling capacitors for integrated circuits. More particularly, this invention relates to novel and improved decoupling capacitors, and methods of formation thereof wherein the capacitors are formed in a two step molding process to form decoupling capacitors which are auto-insertable into printed circuit boards for use in conjunction with dual-in-line integrated circuits or other electronic components.

U.S. patent application Ser. No. 403,408 (which is assigned to the assignee hereof, and the entire contents of which are incorporated herein by reference) discloses a decoupling capacitor for an integrated circuit package. The decoupling capacitor of that prior application is a thin rectangular chip of ceramic material which is metallized on opposite sides and has leads from the metallized coatings on opposite sides of the chip at two points adjacent a pair of diagonally opposed corners of the rectangularly shaped ceramic chip. The two leads are bent downwardly, and the decoupling capacitor assembly is encapsulated in a film of nonconductive material. In accordance with the teachings of that prior application, the decoupling capacitor is dimensioned so as to be received in the space between the two rows of leads extending from a conventional dual-in-line integrated circuit. The two leads from the decoupling capacitor are plugged into a printed circuit board, with these leads from the capacitor being inserted into the printed circuit through holes to which the ground power supply conductors are connected. The associated integrated circuit or other electronic component is then positioned over the capacitor and inserted into the board such that the power supply leads of the integrated circuit or other component will be positioned in the same through holes of the printed circuit board in which the two capacitor leads have been inserted.

The diagonally located leads or pins on the decoupling capacitor of application Ser. No. 403,408 have resulted in a problem when it is desired to automatically insert the decoupling capacitors into the printed circuit board. Standard auto-insertion equipment is available for inserting integrated circuit elements into the printed circuit boards. The insertion heads on standard auto-insertion equipment grasp the integrated circuit about the bent terminal pins or leads of the integrated circuit. Since there are two symmetric rows of pins on the integrated circuit element, the auto-insertion equipment can grasp the integrated circuit element symmetrically and stably for insertion. However, when insertion of the decoupling capacitor of prior application Ser. No. 403,408 is attempted with the same auto-insertion equipment, an unstable condition and misalignment results because of the fact that the decoupling capacitor, rather than having two symmetrical rows of pins, has only two pins at diagonally opposite corners of the rectangular capacitor. Because of the presence of only the two pins, the capacitor "cocks" in the insertion head with the result that misalignment occurs between the terminals of the capacitor in the corresponding holes on the printed circuit board.

Since it is extremely desirable to auto-insert the decoupling capacitors into the printed circuit boards, and since it is equally desirable to perform that auto-insertion with the same auto-insertion equipment used with the integrated circuit elements, a significant problem is encountered with the decoupling capacitor of the prior application, not from the standpoint of its electronic operability and effectiveness, but rather from the standpoint of adapting it to high volume assembly techniques.

A need also exists for a decoupling capacitor structure which is both auto-insertable, hermetically sealed, and capable of being manufactured by automated assembly processes.

U.S. patent application Ser. No. 456,654 (assigned to the assignee hereof) discloses one approach to solving the above discussed auto-insertion problem by the incorporation of dummy or stabilizing pins in a decoupling capacitor assembly. U.S. patent application Ser. No. 551,466 Watson for "Decoupling Capacitor and Method of Manufacture Thereof" and U.S. patent application Ser. No. 552,107 for "Decoupling Capacitor and Method of Manufacture Thereof" of David S. Fishman, both of which are being filed simultaneously herewith and are assigned to the assignee hereof present other constructions of and methods for forming decoupling capacitors with dummy pins or molded stabilizing lugs. The present invention presents other constructions of and methods for forming improved decoupling capacitors which are hermetically sealed, auto-insertable and manufactured in an automated two step molding process.

One problem in many of the prior art configurations is related to the size constraints imposed on the decoupling capacitor system by the intended end use of the capacitor beneath an IC on a printed circuit board. These capacitors typically include a ceramic capacitor chip (a ceramic body with opposed conductive face surfaces), a pair of conductive plates abutting the face surface of the chip with an active pin extending from each plate, and an insulating outer covering or case. In particular, the thickness or height dimension is limited to about 0.038 to 0.040 inch. Since the ceramic capacitor chip is about 0.009 to 0.010 inch thick and each conductive plate is about 0.007 inch thick, only about 0.007 to 0.0085 inch per side remains available for encapsulation or other covering by an insulated casing. Because of manufacturing tolerances, the insulating cover may be breached, thus leading to problems of contamination, short circuiting, etc.

SUMMARY OF THE INVENTION

The above discussed and other problems of the prior art are overcome or substantially reduced by the new and improved decoupling capacitor of the present invention and the method of manufacture thereof. Also, several additional advantages in design, assembly, cost and reliability are realized with the present invention.

Decoupling capacitors of the type to which the present invention are directed have size constraints dictated by the fact that they are intended to fit between an IC and a circuit board on which the IC is mounted. These capacitors typically include a ceramic capacitor chip (a ceramic body with opposed conductive face surfaces), a pair of conductive plates abutting the face surface of the chip with an active pin extending from each plate, and an insulating outer covering or case. In particular, the thickness or height dimension is limited to about 0.038 to 0.040 inch. Since the ceramic capacitor chip is about 0.009 to 0.010 inch thick and each conductive plate is about 0.007 inch thick, only about 0.007 to 0.0085 inch per side remains available for encapsulation or other covering by an insulated casing.

In accordance with the present invention, a subassembly of the decoupling capacitor is formed comprising active leads or pins bonded to the electrode surfaces of the ceramic capacitor chip. Only leads or pins are employed, as distinguished from conductive plates in some prior art embodiments. This eliminates the thickness of the conductive plates over most of the assembly and increases the dimension left available for the insulated housing to from about 0.014 to 0.0155 over most of the assembly, with only the pin or lead area having the thinner coating. The subassembly is then employed, as an insert in a two step molding process to form a hermetically sealed decoupling capacitor. The resulting assembly has the thicker insulated coating (from about 0.014 to 0.0155 inch per side) over most of the assembly, thereby significantly reducing chances of inadvertent exposure of conductive elements and increasing reliability of the decoupling capacitor.

BRIEF DESCRIPTION OF THE DRAWINGS

Referring to the drawings, wherein like elements are numbered alike in the several FIGURES.

DESCRIPTION OF THE PREFERRED EMBODIMENT

Figure 1:
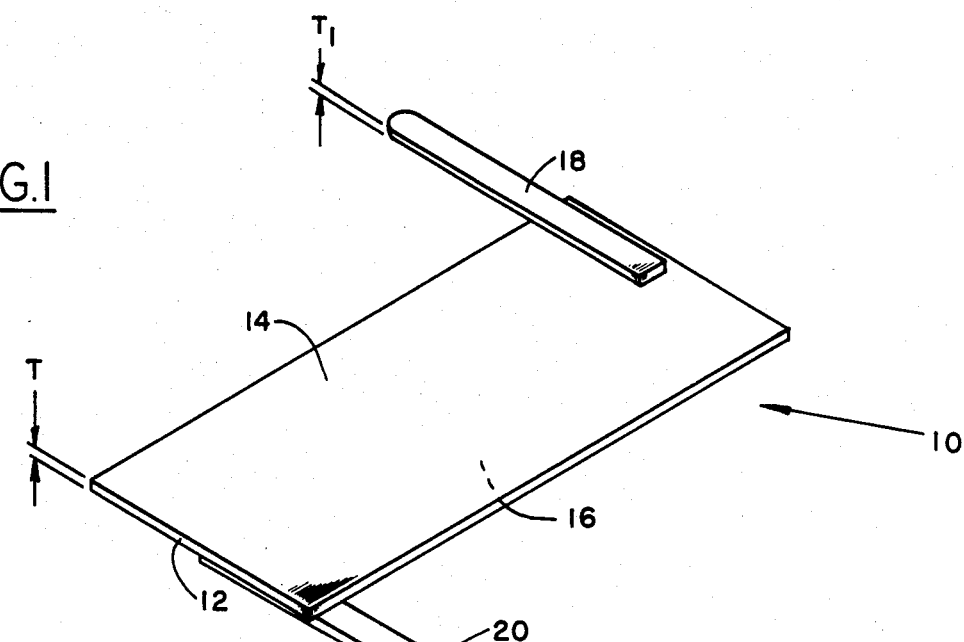
FIG. 1 is a perspective view of a capacitor subassembly in accordance with the present invention.

Referring first to FIG. 1, the capacitive ceramic chip is indicated generally at 10. Capacitive ceramic chip 10 consists of a ceramic capacitor element, such as barrium titinate, in the form of a flat generally rectangular plate 12. The upper and lower surfaces 14 and 16 of plate 12 are coated with a conductive material, preferrably nickel or nickel alloy, in accordance with U.S. patent application Ser. No. 391,967 which is assigned to the assignee hereof and the entire contents of which are incorporated herein by reference. The conductive surfaces 14 and 16 and the ceramic plate sandwiched therebetween constitute a capacitive chip.

Figure 4:
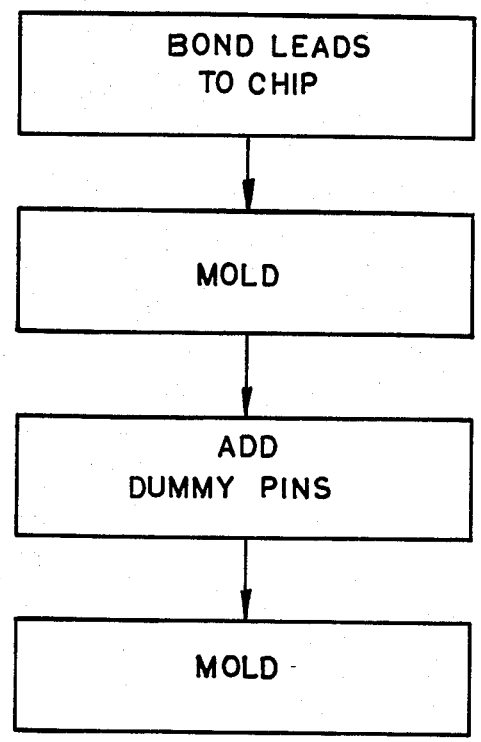
FIG. 4 is a flow diagram illustrating the process of the present invention.

Active pins or leads 18 and 20 are positioned on and bonded to conductive surfaces 14 and 16, respectively, as indicated in Step A of FIG. 4. This bonding of the active pins is accomplished by a metallic bonding procedure that will endure molding temperatures in the range of up to 370° F. Bonding may be accomplished by ultrasonic bonding, soldering, pulse welding, thermosonic bonding, or other suitable metallic bonding processes. Conductive adhesive may also be used.

Figure 2:
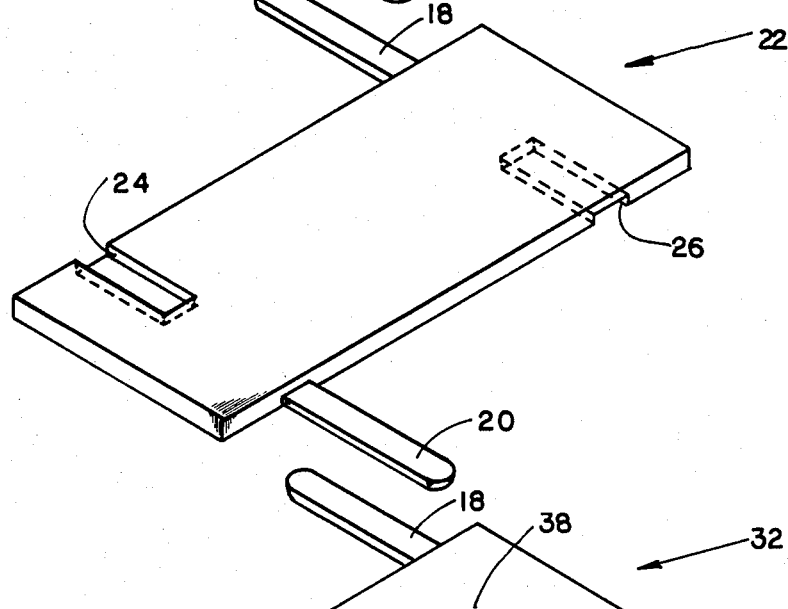
FIG. 2 is a perspective view of the capacitor subassembly after the first molding step in accordance with the present invention.

Referring now to FIG. 2 and Step B of FIG. 4, the subassembly of FIG. 1 serves a mold insert, the subassembly being placed in a mold and a suitable insulating material, such as an epoxy resin, being molded around the part. This epoxy molded item is indicated generally at 22 in FIG. 2. Of particular importance in accordance with the present invention is that the epoxy molded item 22 is formed with a pair of cavities 24 and 26 therein to receive dummy pins for the decoupling capacitor. Cavities 24 and 26 are formed entirely in the molding material; i.e., they are pockets in the molding material which are not opened or exposed to the conductive surfaces 14 and 16 of capacitive chip 10. The molded element of FIG. 2 serves as a preform for another molding step in the present invention.

Figure 3:
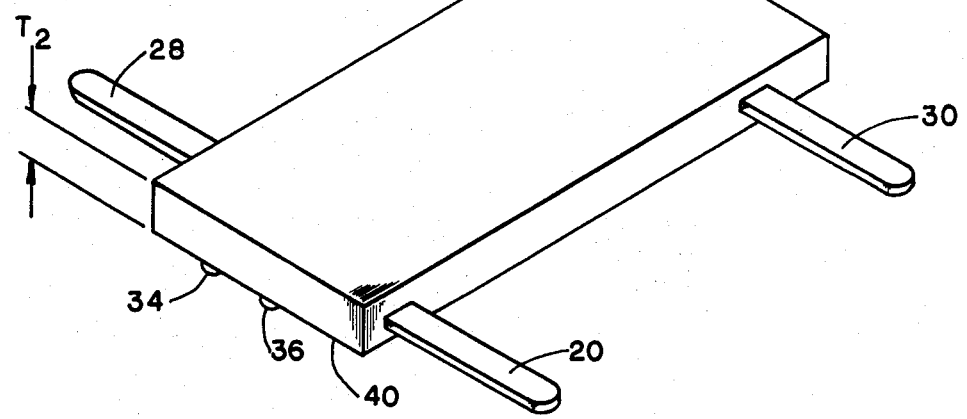
FIG. 3 is a perspective view of the completed decoupling capacitor of the present invention.

Referring next to FIG. 3 and Steps C and D of FIG. 4, dummy pins 28 and 30 (which may be identical to pins 18 and 20) are inserted, respectively, in cavities 24 and 26 to complete the intermediate premold. This intermediate premold, with the dummy pins in the cavities, is then placed in a mold and again epoxy molded in a second epoxy molding step to bond the dummy pins 28 and 30 in place and complete the final decoupling capacitor assembly 32 of FIG. 3. In this final assembly, the two molded layers are bonded together, and the active and dummy pins are rigidly positioned. Since dummy pins 28 and 30 are completed encased in epoxy insulating material, they are electrically isolated from the capacitor although mechanically connected thereto. A pair of spacing ribs 34 and 36 may be formed on the lower surface of the decoupling capacitor to provide slight spacing above the printed circuit board onto which the decoupling capacitor will be mounted.

In the intended use of the decoupling capacitor of the present invention, all four pins will be bent downwardly at 90° angles from that shown in FIG. 3, and the decoupling capacitor will be mounted on a printed circuit board under an integrated circuit. Active leads 18 and 20 will be inserted into the same PC board holes into which the power leads from the IC are located. Dummy pins 28 and 30 will also fit into other holes in the PC board which receive IC pins; but they will have no electrical effect. Dummy pins 28 and 30 serve as stabilizing pins to facilitate the mounting of the decoupling capacitor onto the PC board with the use of auto insertion equipment used for mounting the integrated circuits.

Decoupling capacitors of the type to which the present invention are directed have severe size constraints dictated by the fact that they are intended to fit between an integrated circuit and a circuit board on which the IC is mounted. The thickness or height dimension of the final assemblied decoupling capacitor must be limited to the range of from about 0.038 to about 0.040 inch. The capacitive chip 10 for use in the present invention has a thickness or "t" of about 0.009 to about 0.010 inch; and the active leads 18 and 20 (typically copper) have a thickness "t" of about 0.007 inch. In prior art constructions, such as shown in U.S. patent application Ser. No. 456,654 (which is assigned to the assignee hereof and the contents of which are incorporated herein by reference) a typical construction has conductive plates bonded to conductive surfaces 14 and 16 of chip 10, with the active leads or pins being extensions of these conductive plates. Thus, in that prior art configuration only about 0.007 to about 0.0085 inch per side remains available for a protective insulating coating for the final decoupling capacitor assembly. This covering dimension is so thin that is raises the possibility of inadvertent exposure of the interior of the decoupling capacitor assembly, thereby incurring risks of contamination, short circuiting, etc. The present invention alleviates this problem by eliminating the conductive plates and using only the active pin elements 18 and 20 to accomplish electrical connection to the conductive surfaces of the capacitive chip. In this way, the available space for insulating coating is significantly increased to from about 0.014 to about 0.0155 inch on each side, except in the area of the active pins, per se, where the coating thickness will continue to be in the previous range of from about 0.007 to about 0.0085 inch. Thus, in the completed assembly (see FIG. 3) the decoupling capacitor will have an overall thickness $t_2$ in the range of from 0.038 to 0.040 inch, with most of the upper and lower surfaces 38 and 40 having molded insulated covers ranging in thickness from 0.014 to 0.0155 inch.

In addition to the previously discussed advantages of the present invention, a further advantage is realized in that chip location within the mold is accurately assured in both molding steps because active leads 18 and 20 are bonded to the chip prior to either of the molding steps. Thus, these active pins will sit in appropriate openings or passages in the mold and will aid in assuring proper positioning of the chip in the mold for each molding step. This feature further increases the dimensional stability of the final assemblied unit and contributes to assuring proper and even insulating coating.

The present invention has been discussed in the general configuration of a decoupling capacitor having axial symmetry, with a pair of diagonally opposed active terminal pins and a pair of diagonally opposed dummy pins. However, it will be understood that this configuration is described for purposes of illustration of the preferred configuration for use with an integrated circuit having diagonally opposed power supply pins; but the present invention is not limited to this configuration. The decoupling capacitor of the present invention can be configured as may be dictated by the configuration and requirements of the integrated circuit or other electronic component with which it is to be used. Thus, for example, if the power supply pins of the integrated circuit are not at diagonally opposed locations, the dummy pins will be located at such other locations, as may be dictated by the location of the power supply pins, to balance the power supply pins; and the number of active pins of the decoupling capacitor may be more than two (to match an IC having more than two power leads); and the number and location of dummy pins need not always be symmetrical with respect to the active pins; all of the above being within the general requirement that the active leads and dummy pins be arranged to provide an array of stabilized engagement sites or surfaces for stabilized engagement by the jaws of auto insertion equipment.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. The method of making a decoupling capacitor, including the steps of:

forming a subassembly of a plurality of active terminal pins mechanically and electrically connected to opposed conductive face surfaces of a capacitive element, said capacitive element being a dielectric body with opposed conductive face surfaces;

performing a first molding step wherein said subassembly is encapsulated in a molding material with said active terminal pins projecting therefrom, said first molding step also including the formation of a plurality of cavities entirely in the molding material;

inserting dummy pins in said cavities to form an intermediate premold element;

performing a second molding step to mold a layer of molding material around said intermediate premold element to mechanically lock said dummy pins in said cavities, said dummy pins being electrically isolated from said capacitive element.

2. The method of claim 1 including the step of:

positioning said active terminal pins in corresponding openings in molds in each of said first and second molding steps.

3. The method of claim 1 wherein:

said plurality of active terminal pins are arranged in a predetermined pattern; and said dummy pins are arranged in a predetermined pattern to balance the pattern of active terminal pins.

4. The method of claim 1 wherein:

the step of forming a subassembly includes connecting first and second active terminal pins to opposed face surfaces of said capacitive element; and the step of inserting dummy pins includes positioning first and second dummy pins in cavities located in positions to balance said first and second active terminal pins.

5. The method of claim 1 wherein:

the step of forming a subassembly includes connecting first and second active terminal pins to said capacitive element at diagonally opposed locations on the opposed conductive face surface thereof; and said step of inserting dummy pins includes positioning dummy pins at diagonally opposed locations to balance said active terminal pins.

6. The method of claim 1 wherein:

the decoupling capacitor has an overall thickness of from about 0.038 inch to about 0.040 inch;

the capacitive element has a thickness of from about 0.009 inch to about 0.010 inch;

the active terminal pins each have a thickness of about 0.007 inch; and the thickness of molded material resulting from both of said first and second molding steps is from about 0.014 inch to about 0.0155 inch on each face of said capacitive element except at the locations of active pins.

7. A decoupling capacitor including:

a capacitive element having first and second opposed electrically conductive face surfaces thereon;

a plurality of active terminal pins mechanically and electrically connected to said opposed first and second face surfaces of the capacitive element;

a first layer of insulating material molded around said capacitive element, with said active terminal pins projecting therefrom;

a plurality of dummy pins positioned in cavities formed in said first layer of insulating material; and a second layer of insulating material molded around said first layer of insulating material and mechanically locking said dummy pins in position.

8. The decoupling capacitor of claim 7 wherein:

said plurality of active terminal pins are arranged in a predetermined pattern; and said dummy pins are arranged in a predetermined pattern to balance the pattern of active terminal pins.

9. The decoupling capacitor of claim 7 wherein:

a first terminal pin is connected to said first face surface of said capacitive element;

a second terminal pin is connected to said second face surface of said capacitive element;

a first dummy pin is positioned to balance said first active terminal pin; and a second dummy pin is positioned to balance said second active terminal pin.

10. The capacitor of claim 9 wherein:

said first and second active terminal pins are connected to said capacitive element at diagonally opposed locations; and said dummy pins are located at diagonally opposed positions to balance said active terminal pins.

11. The capacitor of claim 7 wherein:

the decoupling capacitor has an overall thickness of from about 0.038 inch to about 0.040 inch;

the capacitive element has a thickness of from about 0.009 inch to about 0.010 inch;

the active terminal pins each have a thickness of about 0.007 inch; and the thickness of molded material resulting from both of said first and second molding steps is from about 0.014 inch to about 0.0155 inch on each face of said capacitive element except at the locations of active pins.

* * * * *